United States Patent
Zhou et al.

(10) Patent No.: US 7,916,469 B2
(45) Date of Patent: Mar. 29, 2011

(54) HEAT DISSIPATION DEVICE

(75) Inventors: Shi-Wen Zhou, Shenzhen (CN); Jun Cao, Shenzhen (CN); Qing-Song Xu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tucheng, Taipei County (TW)

( * ) Notice: Subject to any disclaimer, the term of this patent is extended or adjusted under 35 U.S.C. 154(b) by 72 days.

(21) Appl. No.: 12/436,786

(22) Filed: May 7, 2009

(65) Prior Publication Data

US 2010/0097763 A1    Apr. 22, 2010

(30) Foreign Application Priority Data

Oct. 20, 2008  (CN) .......................... 2008 1 0305019

(51) Int. Cl.
*G06F 1/20*    (2006.01)
*H05K 7/20*    (2006.01)

(52) U.S. Cl. ......... 361/679.47; 361/679.48; 361/679.52; 361/679.54; 361/695; 361/697; 361/700; 361/703; 361/704; 361/719; 165/80.3; 165/185; 174/15.2; 174/16.1; 174/16.3

(58) Field of Classification Search .......... 361/679.47–679.48, 679.52, 679.54, 361/694–695, 697, 699–700, 702–704, 709–710, 361/719; 165/80.2–80.5, 104.33, 185; 174/15.2, 174/16.1, 16.3
See application file for complete search history.

(56) References Cited

U.S. PATENT DOCUMENTS

| | | | |
|---|---|---|---|
| 6,625,021 B1 * | 9/2003 | Lofland et al. ................ 361/697 |
| 6,945,318 B2 * | 9/2005 | Ma et al. .................. 165/104.33 |
| 7,128,135 B2 * | 10/2006 | Mok et al. ................ 165/104.26 |
| 7,142,427 B2 * | 11/2006 | Reents .......................... 361/704 |
| 7,333,336 B2 * | 2/2008 | Kim .............................. 361/709 |
| 7,661,466 B2 * | 2/2010 | Li et al. ................... 165/104.33 |
| 7,757,751 B2 * | 7/2010 | Zhou et al. .............. 165/104.33 |
| 2008/0121371 A1 * | 5/2008 | Zhou et al. .................. 165/80.3 |
| 2010/0155023 A1 * | 6/2010 | Zhou et al. .................. 165/80.3 |

FOREIGN PATENT DOCUMENTS

CN    200969730 Y   * 10/2007
CN    101409996 A   *  4/2009

* cited by examiner

*Primary Examiner* — Robert J Hoffberg
(74) *Attorney, Agent, or Firm* — Frank R. Niranjan

(57) ABSTRACT

A heat dissipation device adapted for cooling an electronic device mounted on a printed circuited board includes a heat spreader thermally contacting the electronic device, a fin assembly comprising a plurality of fins, a first heat pipe interconnecting the fin assembly and the heat spreader and a plurality of supporting posts inserted in the fin assembly.

16 Claims, 2 Drawing Sheets

HEAT DISSIPATION DEVICE

BACKGROUND

1. Technical Field

The disclosure relates to heat dissipation devices and, more particularly, to a heat dissipation device with a strengthened structure.

2. Description of Related Art

Nowadays, numerous heat dissipation devices are used to dissipate heat generated by electronic devices. Conventionally, the heat dissipation device comprises a heat spreader thermally contacting the electronic device, a fin assembly, and a heat pipe thermally connecting the fin assembly and the heat spreader. The fin assembly comprises a plurality of fins stacked together, which is prone to deforming when subjected to shock or vibration during transportation or use.

What is needed, therefore, is a heat dissipation device which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
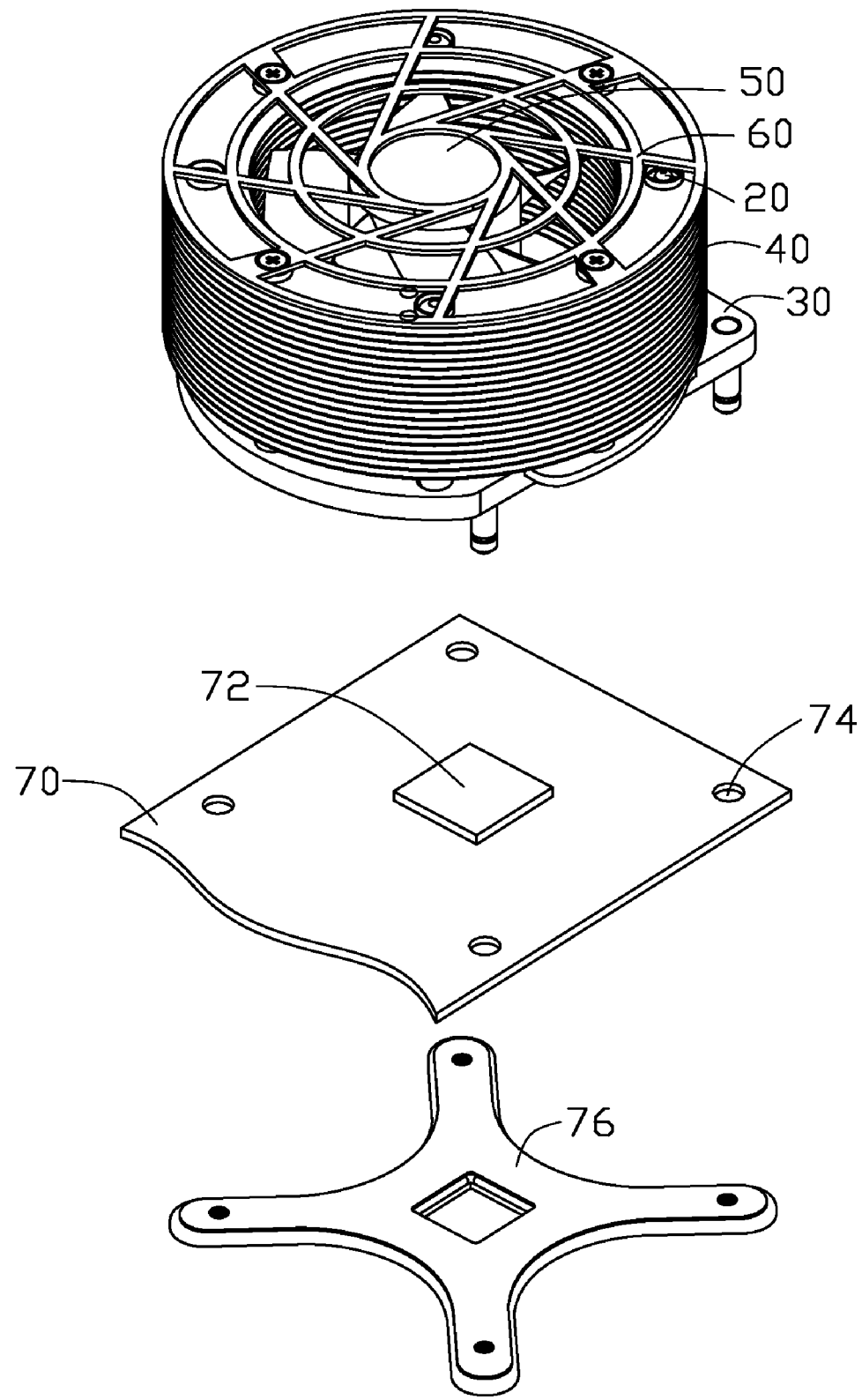
FIG. 1 is an isometric, assembled view of a heat dissipation device in accordance with one embodiment of the disclosure, with a printed circuit board located below the heat dissipation device.

FIG. 1 shows a heat dissipation device in accordance with an embodiment of the disclosure. The heat dissipation device is mounted on a printed circuit board 70 for dissipating heat generated by an electronic device 72 attached on the printed circuit board 70.

Figure 2:
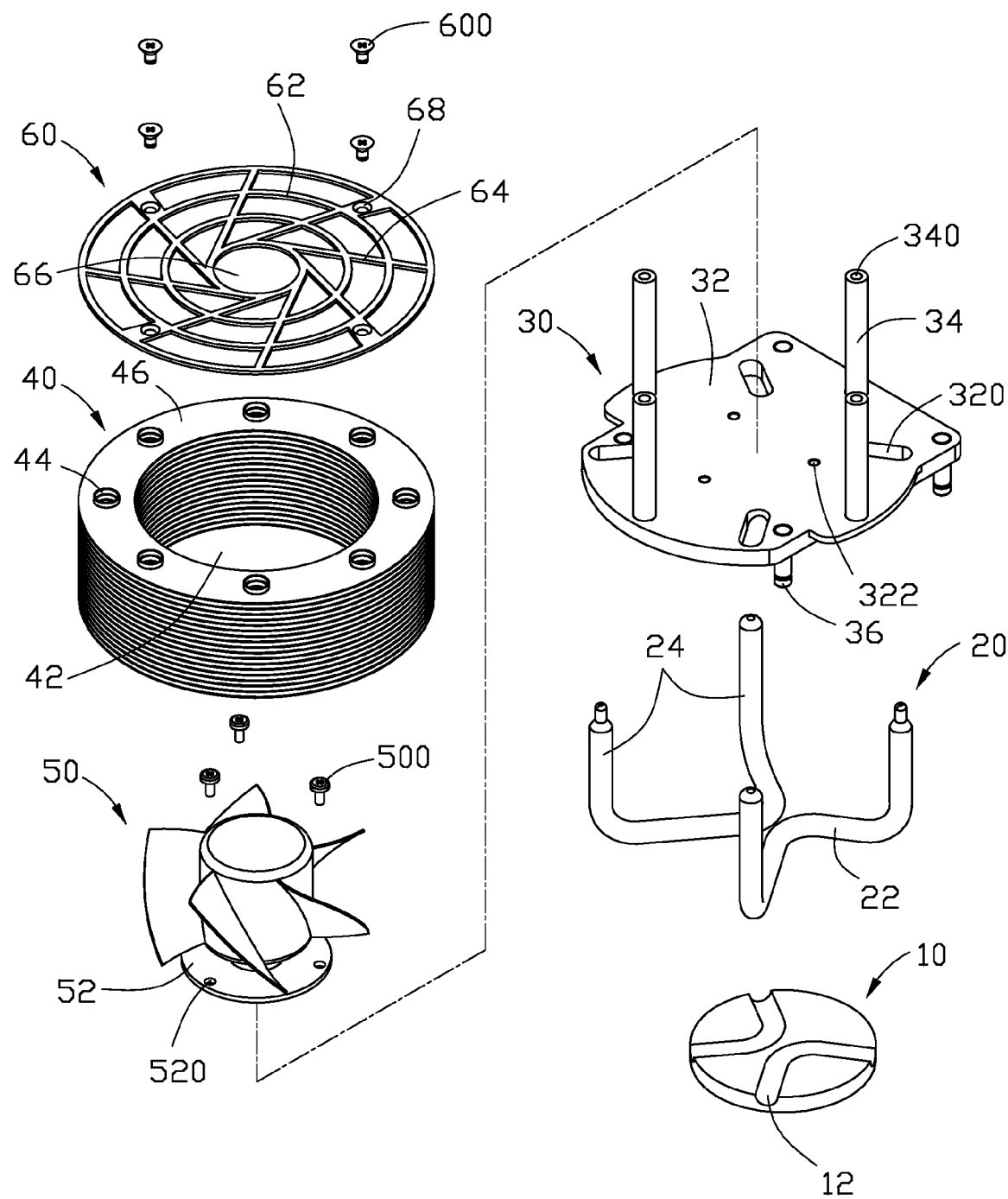
FIG. 2 is an isometric, exploded view of the heat dissipation device of FIG. 1.

Also referring to FIG. 2, the heat dissipation device comprises a heat spreader 10 thermally contacting the electronic device 72, two heat pipes 20 symmetrically disposed on the heat spreader 10, a heat conducting member 30 mounted over the heat spreader 10 and spacing a distance from the heat spreader 10, a fin assembly 40 attached on the heat conducting member 30 and connecting the heat pipes 20, a fan 50 received in the fin assembly 40 and fastened on the heat conducting member 30, and a fan cover 60 disposed on a top of the fin assembly 40.

The heat spreader 10 is made of metal such as aluminum, copper or an alloy thereof. The heat spreader 10 has a bottom face thermally contacting the electronic device 72. Two V-shaped grooves 12 are symmetrically defined in a top face of the heat spreader 10.

The two heat pipes 20 each comprise a V-shaped evaporating section 22 corresponding to the groove 12 of the heat spreader 10 and two parallel condensing sections 24 vertically and upwardly extending from two ends of the evaporating section 22.

The heat conducting member 30 is made of metal such as aluminum, copper or an alloy thereof. The heat conducting member 30 comprises a heat conducting plate 32, four supporting posts 34 evenly disposed on a periphery of a top of the heat conducting plate 32 and four fasteners 36 disposed on four corners of a bottom of the heat conducting plate 32. Each supporting post 34 is a solid metal pole and defines a threaded hole 340 in a top end thereof. The heat conducting plate 32 defines four elongated through holes 320 corresponding to the condensing sections 24 of the heat pipes 20, each through hole 320 is located between two adjacent supporting posts 34. The heat conducting plate 32 defines three symmetrical fixing holes 322 in a center thereof. The fasteners 36 extend through holes 74 of the printed circuit board 70 and engage with a back plate 76 below the printed circuit board 70 to thereby secure the heat dissipation device on the printed circuit board 70 so that the heat spreader 10 can have an intimate engagement with the electronic device 72.

The fin assembly 40 is cylinder-shaped and comprises a plurality of spaced and parallel fins 46. The fins 46 each are made of metal such as aluminum, copper or an alloy thereof. The fin assembly 40 defines a column-shaped receiving room 42 in a center thereof and eight spaced through holes 44 around the receiving room 42.

The fan 50 has a fixing plate 52 and an impeller (not labeled) mounted thereon. The fixing plate 52 defines three through holes 520 corresponding to the fixing holes 322 of the heat conducting plate 32.

The fan cover 60 defines a central hole 66 in alignment with a hub (not labeled) of the impeller of the fan 50. The fan cover 60 comprises a plurality of annular strips 62 concentrically surrounding the hole 66, and a plurality of elongated strips 64 slantwise interconnecting the annular strips 62 in such a manner that the elongated strips 64 are arranged in a volute relative to the hole 66. The fan cover 60 is for preventing an operator from injury by carelessly touching blades (not labeled) of the impeller of the fan 50 when the fan 50 is in operation. The fan cover 60 defines four through holes 68 in an edge thereof, corresponding to the threaded holes 340 of the supporting posts 34.

In assembly, the evaporating sections 22 of the heat pipes 20 are received and soldered in the grooves 12 of the heat spreader 10. Screws 500 extend through the through holes 520 of the fixing plate 52 of the fan 50 and engage in the fixing holes 322 of the heat conducting plate 32 to thereby fix the fan 50 on the heat conducting member 30. The supporting posts 34 of the heat conducting member 30 extend through the through holes 44 of the fin assembly 40 to thereby securely connect the fin assembly 40 and the heat conducting member 30 together. The condensing sections 24 of the heat pipes 20 extend through the through holes 320 of the heat conducting plate 32 and the through holes 44 of the fin assembly 40 in sequence to thereby securely connect the heat pipes 20 and the fin assembly 40 together. Screws 600 extend through the through holes 68 of the fan cover 60 and engage in threaded holes 340 of the supporting posts 34 to thereby fix the fan cover 60 on the fin assembly 40.

In use, the heat spreader 10 absorbs heat from the electronic device 72 and transmits it to the heat pipes 20. The heat pipes 20 convey the heat to the fin assembly 40. A part of the heat in the fin assembly 40 is further conveyed to the heat conducting plate 32 via the supporting posts 34. The fan 50 generates airflow to take the heat in the fin assembly 40 and the heat conducting plate 32 away.

According to the disclosure, the supporting posts 34 inserted in the fin assembly 40 can effectively support and prevent the fin assembly 40 from deforming when subjected to vibration or shock during transportation or use.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device adapted for cooling an electronic device mounted on a printed circuited board, the heat dissipation device comprising:
   a heat spreader thermally contacting the electronic device;
   a fin assembly comprising a plurality of fins;
   a first heat pipe interconnecting the fin assembly and the heat spreader;
   a back plate; and
   a heat conducting plate defining a plurality of slots, the heat conducting plate comprising
   a plurality of supporting posts extend from a first side of the heat conducting plate, wherein the plurality of support posts are inserted in the fin assembly, and each of the plurality of supporting posts being a solid metal pole; and
   a plurality of fasteners extend from a second side of the heat conducting plate and engage with the back plate such that the circuit board is positioned between the back plate and the heat spreader;
   wherein a first portion of the first heat pipe extends through the plurality of slots of the heat conducting plate, and a second portion of the first heat pipe contacts the heat spreader.

2. The heat dissipation device as claimed in claim 1, wherein the plurality of fins are stacked together.

3. The heat dissipation device as claimed in claim 1, wherein the plurality of fins define a plurality of through holes, each of the plurality of through holes for the each of the plurality of supporting posts or for and one end of the first heat pipe to extend therethrough.

4. The heat dissipation device as claimed in claim 3, wherein the first heat pipe comprises an evaporating section being the second portion of the first heat pipe and two condensing sections extending from two ends of the evaporating section, each of the two condensing sections being the one end of the first heat pipe, the two condensing sections being inserted in the fin assembly, and a corresponding supporting post of the plurality of supporting posts being located between the two condensing sections of the first heat pipe.

5. The heat dissipation device as claimed in claim 4, further comprising a second heat pipe symmetrical with the first heat pipe, the second heat pipe comprising a second evaporating section and two second condensing sections extending from two ends of the second evaporating section and inserted in the fin assembly, each of the condensing sections of the first heat pipe and each of the second condensing sections of the second heat pipe being located between two adjacent supporting posts of the plurality of supporting posts.

6. The heat dissipation device as claimed in claim 4, wherein the heat spreader is spaced from the heat conducting plate.

7. The heat dissipation device as claimed in claim 6, further comprising a fan, the fin assembly being cylinder-shaped and defining a receiving room in a center thereof, the fan being fixed on the heat conducting plate and received in the receiving room of the fin assembly.

8. The heat dissipation device as claimed in claim 4, wherein the evaporating section of the first heat pipe is received and soldered in the heat spreader.

9. The heat dissipation device as claimed in claim 8, wherein the evaporating section of the first heat pipe is V-shaped, the heat spreader defining a V-shaped groove, and the evaporating section of the first heat pipe being embedded in the groove of the heat spreader.

10. The heat dissipation device as claimed in claim 1 further comprising a cover and a plurality of screws, wherein the each of the plurality of supporting posts defines a threaded hole in an end thereof, and each of the plurality of screws extends through the cover and is engaged in the threaded hole of the each of the plurality of supporting posts to fix the cover on the fin assembly.

11. The heat dissipation device as claimed in claim 10, wherein the plurality of supporting posts all extend through the fin assembly.

12. The heat dissipation device as claimed in claim 10, wherein the cover comprises a plurality of annular strips and a plurality of elongated strips slantwise interconnecting the plurality of annular strips.

13. The heat dissipation device as claimed in claim 10, wherein the fin assembly defines a room receiving a fan therein, and the fan is covered by the cover.

14. A heat dissipation device adapted for cooling an electronic device mounted on a printed circuited board, the heat dissipation device comprising:
   a heat spreader for thermally contacting the electronic device;
   a back plate;
   a heat conducting member mounted over the heat spreader and defining a plurality of slots, the heat conducting plate comprising
   a plurality of supporting posts extend from a first side of the heat conducting plate, each of the plurality of supporting posts being a solid metal pole; and
   a plurality of fasteners extend from a second side of the heat conducting plate and engage with the back plate such that the printed circuit board is positioned between the back plate and the heat spreader;
   a fin assembly comprising a plurality of fins and mounted over the heat conducting member, wherein the plurality of support posts extend into the fin assembly; and
   a heat pipe having an evaporating section connecting with the heat spreader and a condensing section extending from the evaporating section through the plurality of slots of the heat conducting member to connect with the fin assembly.

15. The heat dissipation device as claimed in claim 14, further comprising a fan, wherein the fin assembly defines a central hole therein, the fan being received in the central hole and secured to the heat conducting member.

16. The heat dissipation device as claimed in claim 15, further comprising a cover arranged on the fin assembly, and a plurality of screws, wherein the each of the plurality of supporting posts defines a threaded hole in an end thereof, and each of the plurality of screws extends through the cover and engages in a respective threaded hole to fix the cover on the fin assembly.

* * * * *